(12) United States Patent
Lotfy et al.

(10) Patent No.: US 9,628,094 B2
(45) Date of Patent: Apr. 18, 2017

(54) APPARATUS AND METHOD FOR FAST PHASE LOCKING FOR DIGITAL PHASE LOCKED LOOP

(71) Applicant: INTEL CORPORATION, Santa Clara, CA (US)

(72) Inventors: Amr M. Lotfy, Qattameya (EG); Mohamed A. Abdelsalam, Giza (EG); Mamdouh O. Abd El-Mejeed, Alexandria (EG); Nasser A. Kurd, Portland, OR (US); Mohamed A. Abdelmoneum, Portland, OR (US); Mark Elzinga, El Dorado, CA (US); Young Min Park, Folsom, CA (US); Jagannadha R. Rapeta, Folsom, CA (US); Surya Musunuri, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/127,963

(22) PCT Filed: Sep. 26, 2013

(86) PCT No.: PCT/US2013/061997
§ 371 (c)(1),
(2) Date: Dec. 19, 2013

(87) PCT Pub. No.: WO2015/047280
PCT Pub. Date: Apr. 2, 2015

(65) Prior Publication Data
US 2016/0204787 A1   Jul. 14, 2016

(51) Int. Cl.
*H03L 7/06* (2006.01)
*H03L 7/10* (2006.01)
(Continued)

(52) U.S. Cl.
CPC .......... *H03L 7/105* (2013.01); *G04F 10/005* (2013.01); *H03L 7/085* (2013.01); *H03L 7/0992* (2013.01);
(Continued)

(58) Field of Classification Search
CPC ...................................... H03L 7/105
See application file for complete search history.

(56) References Cited

U.S. PATENT DOCUMENTS 7,675,440 B1   3/2010   Xiao et al.
8,207,770 B1   6/2012   Ravi et al.
(Continued)

FOREIGN PATENT DOCUMENTS

DE   102010053361   6/2011

OTHER PUBLICATIONS

PCT International Search Report and Written Opinion of the International Searching Authority for Int'l Application No. PCT/US2013/072101, mailed Aug. 14, 2014 (7 pages).
(Continued)

*Primary Examiner* — Daniel Puentes
(74) *Attorney, Agent, or Firm* — Blakely, Sokoloff, Taylor & Zafman LLP

(57) ABSTRACT

Described is an integrated circuit (IC) with a phase locked loop with capability of fast locking. The IC comprises: a node to provide a reference clock; a digitally controlled oscillator (DCO) to generate an output clock; a divider coupled to the DCO, the divider to divide the output clock and to generate a feedback clock; and control logic operable to reset the DCO and the divider, and operable to release reset in synchronization with the reference clock. An apparatus for zeroing phase error is provided which comprises a first node to provide a reference clock; a second node to provide a feedback clock; a time-to-digital converter,
(Continued)

100 coupled to the first and second nodes, to measure phase error between the reference and feedback clocks; a digital loop filter; and a control unit to adjust the measured phase error, and to provide the adjusted phase error to the digital loop filter.

16 Claims, 11 Drawing Sheets

(51) Int. Cl.
     *G04F 10/00*      (2006.01)
     *H03L 7/099*      (2006.01)
     *H03L 7/085*      (2006.01)

(52) U.S. Cl.
     CPC ............... *H03L 7/10* (2013.01); *H03L 7/103* (2013.01); *H03L 2207/06* (2013.01)

(56) References Cited

U.S. PATENT DOCUMENTS

| | | |
|---|---|---|
| 2009/0054075 A1 | 2/2009 | Boejer et al. |
| 2009/0307381 A1 | 12/2009 | Croyle et al. |
| 2010/0091688 A1 | 4/2010 | Staszewski et al. |
| 2011/0131356 A1 | 6/2011 | Devam et al. |
| 2012/0319748 A1* | 12/2012 | Luo .................... H03L 7/085 327/158 |
| 2013/0002317 A1 | 1/2013 | Frantzeskakis et al. |

OTHER PUBLICATIONS

PCT International Search Report and Written Opinion of the International Searching Authority for Int'l Application No. PCT/US2013/061997, mailed Jun. 19, 2044, 7 pages.

Notification Concerning Transmittal of International Preliminary Report on Patentability of the International Searching Authority issued for International Patent Application No. PCT/US2013/061997, mailed Apr. 7, 2016.

The Office Action for counterpart German Application No. 11 2013 007 280.7, 15 pages, mailed Jul. 12, 2016 including translation.

* cited by examiner

APPARATUS AND METHOD FOR FAST PHASE LOCKING FOR DIGITAL PHASE LOCKED LOOP

CLAIM OF PRIORITY

This application claims the benefit of priority of International Patent Application No. PCT/US2013/061997 filed Sep. 26, 2013, titled "APPARATUS AND METHOD FOR FAST PHASE LOCKING FOR DIGITAL PHASE LOCKED LOOP," which is incorporated by reference in its entirety.

BACKGROUND

Power management granularity and power state exit latencies are affected by lock time of a phase locked loop (PLL). One way to speed up lock time for a PLL is to apply lookup tables (LUTs) that store PLL signal conditions for fast lock. However, such traditional uses of LUTs continue to exhibit long phase lock times (e.g., 40-100 reference cycles). A power management controller may save power by clock gating, and to some extent by shutting down PLLs when they are not in use. However, a limiting factor to the power reduction from power management of the clocking of the whole system is the latency of the power on of PLLs. As processors are expected to operate in various power states (e.g., sleep, idle, normal, etc.), moving from one power state to another may cause the PLL to re-lock, which takes time and power.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
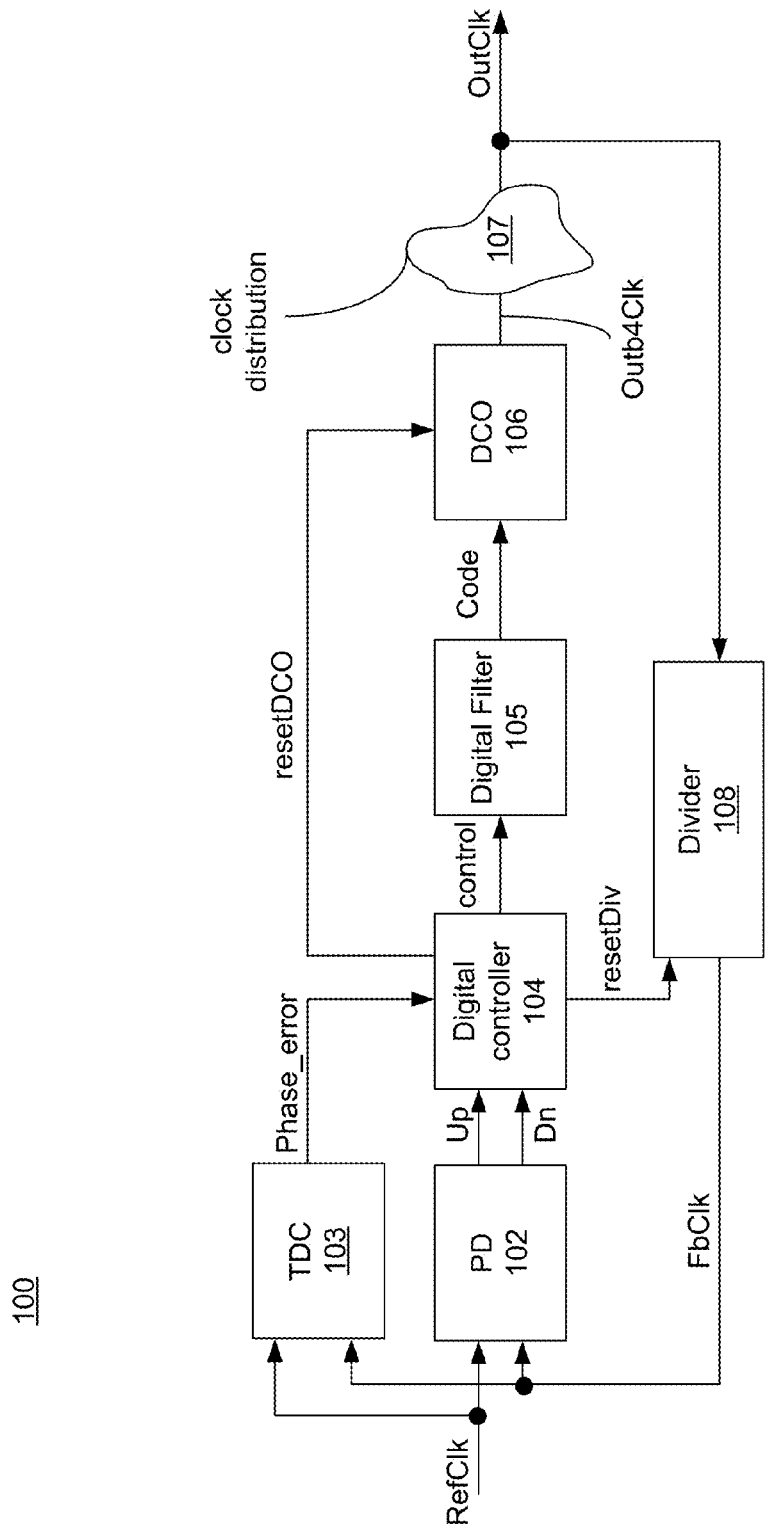
FIG. 1 illustrates a digital phase locked loop (DPLL) for fast locking, according to one embodiment of the disclosure.

The embodiments describe a digital phase locked loop (DPLL) in which the DPLL achieves phase lock in just a few reference clock (RefClk) cycles (for example, (2 to 6 reference cycles after the frequency is locked). In one embodiment, a controller (or a finite state machine) resets the frequency divider and/or the digitally controlled oscillator (DCO) and then releases both the divider and/or the DCO from reset such that an edge of the DCO output clock (OutClk) is in synchronization with an edge of the RefClk. In such an embodiment, the feedback clock (FBClk), which is an output of the divider, is phase aligned to the RefClk.

While the embodiments are described with reference to DCO for a DPLL, other types of oscillators and PLLs may be used. For example, a voltage controlled oscillator (VCO), or an LC (inductor-capacitor) tank based oscillator may be used.

In one embodiment, the controller also reduces the phase error between the RefClk and the FbClk to a very small value. In such an embodiment, the TDC (time-to-digital converter) does not have to cover large range of phase error. Reducing the TDC coverage range reflects as power and area savings in the DPLL. In one such embodiment, FbClk (i.e., low frequency version of the OutClk) may be used by the TDC to realize more power savings in the DPLL.

Normally frequency lock, which is required for the PLL to lock, requires many reference clock cycles. In one embodiment, a fast frequency calibration method and circuit is provided which uses a TDC to frequency lock the PLL in a couple of reference clock cycles. In one embodiment, the fast frequency calibration method and circuit adjusts the DCO frequency control code from previous lock, if frequency drift occurred.

In one embodiment, hardware is provided in the DPLL for instant (or substantially instant) phase lock using a phase error zeroing method (also referred to as a phase offset subtraction method). In one embodiment, with the phase error zeroing method, the DPLL achieves near instant lock, or lock on the first edge of RefClk signal cycle, instead of the many RefClk signal cycles it normally requires without this technique.

In one embodiment, the process of fast locking after wake-up of the PLL may combine any or all methods discussed in the disclosure. For example, the process of fast locking may comprise: restoring of saved frequency control codeword for the DCO; correcting frequency to compensate for temperature drift (i.e., performing fast frequency calibration); resetting the divider and/or the DCO depending on the delay of the clock distribution network; and correcting phase error using loop dynamics and phase error zeroing method.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and the include plural references. The meaning of in includes in and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a digital phase locked loop (DPLL) 100 for fast locking, according to one embodiment of the disclosure. In one embodiment, DPLL 100 comprises phase detector (PD) 102, TDC 103, digital controller 104, digital loop filter 105, DCO 106, clock distribution 107 (optional), and frequency divider 108. In one embodiment, PD 102 compares RefClk signal and FbClk signal to generate phase difference signals. In one embodiment, the phase difference signals are Up and Dn (down) signals. In one embodiment, TDC 103 also receives RefClk and FbClk signals to generate phase error signal. Here, names for signals and nodes carrying those signals are interchangeably used. For example, FbClk is used to represent FbClk signal or FbClk node, depending on the context of the sentence.

In one embodiment, digital controller 104 (or finite state machine) receives the phase error, Up, and Dn signals to generate a control signal for adjusting coefficients of digital filter 105 according to the phase error and/or Up and Dn signals. In one embodiment, digital filter 105 generates a code for controlling the oscillation frequency of DCO 106. In one embodiment, output of DCO (i.e., OutClk) is directly received by frequency divider 108 that generates the FbClk signal by dividing down OutClk signal. In one embodiment, output Outb4Clk of DCO 106 is received by a clock distribution network 107 then provides OutClk to divider 108. In one embodiment, digital controller 104 generates resetDiv and/or resetDCO signals to reset divider 108 and DCO 106 respectively.

In one embodiment, after DPLL 100 locks (i.e., RefClk signal and FbClk signal are substantially phase aligned), code for controlling oscillation frequency of DCO 106 is stored in memory. In one embodiment, coefficients of digital filter 105 are also stored in memory when DPLL 100 locks. The following embodiments of fast locking are discussed with reference to waking up and relocking of the DPLL after it shut down or entered a low power state.

In one embodiment, when the clock distribution 107 is very small or non-existent, digital controller 104 causes DCO 106 and divider 108 to reset. The term "reset" here generally refers to causing a circuit to enter a deterministic state. Releasing from reset means to end the reset process and allow the circuit (which was previously reset) to resume its normal operation.

In one embodiment, DCO 106 and divider 108 are reset and released in synchronization with RefClk signal. In such an embodiment, divider 108 will start dividing OutClk signal in synchronization with RefClk signal. In one embodiment, DPLL 100 acquires frequency lock prior to digital controller 104 resetting divider 108 and/or DCO 106. In such an embodiment, digital controller 104 applies the digital code previously stored in a look-up table or memory. In this embodiment, the falling (or rising) edge of FbClk signal is synchronized with the falling (or rising) edge of RefClk signal with minimal phase error (which is the delay from the output of DCO 106 to the output of divider 108). In one embodiment, falling (or rising) edge of OutClk signal (or Outb4Clk signal) is synchronized with the falling (or rising) edge of RefClk signal. In one embodiment, DPLL 100 can correct this small phase error in a very short time.

Figure 2:
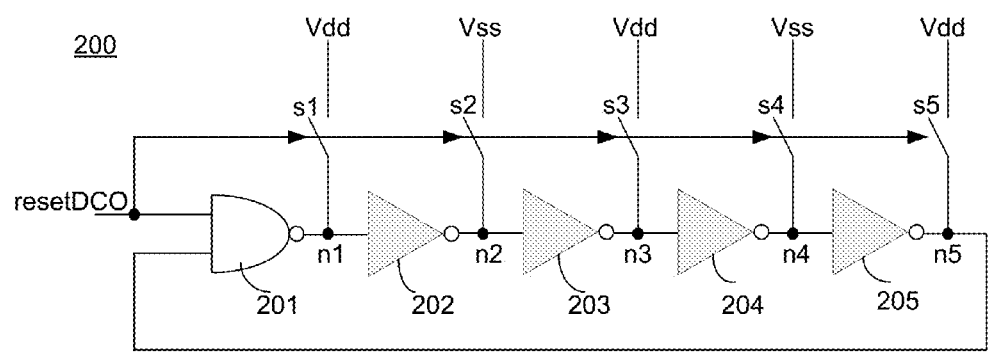
FIG. 2 illustrates a digitally controlled oscillator (DCO) of the DPLL which is operable to be reset for fast locking, according to one embodiment of the disclosure.

FIG. 2 illustrates a DCO 200 of the DPLL 100 which is operable to be reset for fast locking, according to one embodiment of the disclosure. It is pointed out that those elements of FIG. 2 having the same reference numbers (or names) as the elements of any other figure can operate or function in any manner similar to that described, but are not limited to such.

In one embodiment, DCO 200 comprises a plurality of delay cells coupled together in series and a ring to cause the DCO 200 to oscillate. So as not to obscure the embodiments, all inputs and circuit elements of DCO 200 are not illustrated. In this embodiment, the plurality of delay cells include a logic gate 201 (e.g., NAND gate) and inverters 202, 203, 204, and 205. In one embodiment, output node n1 of logic gate 201 is coupled to switch s1 and input of inverter 202. In one embodiment, output node n2 of inverter 202 is coupled to switch s2 and input of inverter 203. In one embodiment, output node n3 of inverter 203 is coupled to switch s3 and input of inverter 204. In one embodiment, output node n4 of inverter 204 is coupled to switch s4 and input of inverter 205. In one embodiment, output node n5 of inverter 205 is coupled to switch s5 and input of logic gate 201. In one embodiment, node n5 is coupled to OutClk signal or Outb4Clk signal. While the embodiments show a ring of five delay cells, any number of delay cells may be used in a ring to form a DCO. For example, for single ended delay cells, an odd number of delay cells may be used in a ring, while for differential ended delay cells an even number of delay cells may be used in a ring.

In one embodiment, logic gate 201 receives resetDCO signal from controller 104 to reset DCO 200. In one embodiment, resetDCO signal is used to control switches s1-s5 so that a known state is applied to nodes n1-n5. In one embodiment, known states are applied to nodes n1-n5 by coupling switches s1-s5 to either Vdd (i.e. power supply or Vss (i.e., ground) respectively. In this embodiment, switch s1 is operable to couple Vdd to node n1 when switch s1 is closed by resetDCO signal. In this embodiment, switch s2 is operable to couple Vss to node n2 when switch s2 is closed by resetDCO signal. In this embodiment, switch s3 is operable to couple Vdd to node n3 when switch s3 is closed by resetDCO signal. In this embodiment, switch s4 is operable to couple Vss to node n4 when switch s4 is closed by resetDCO signal. In this embodiment, switch s5 is operable to couple Vdd to node n5 when switch s5 is closed by resetDCO signal. Other methods and means for applying deterministic voltage levels on nodes n1-n5 may be used so that when DCO 200 is reset, it stops oscillating and generates a stable known output.

Figure 3:
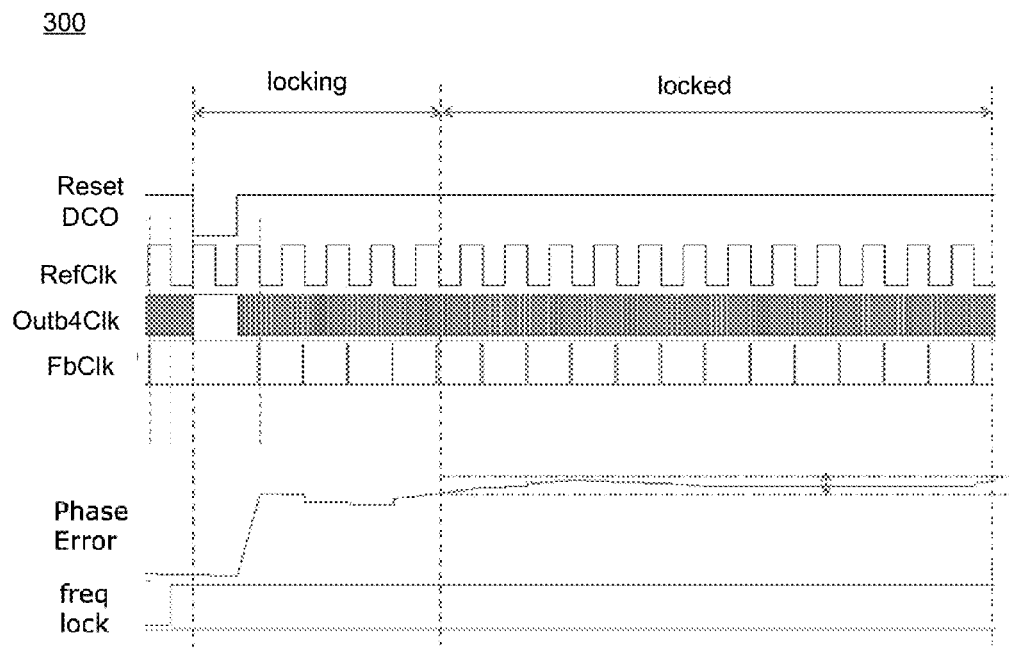
FIG. 3 illustrates a plot with waveforms showing operation of the fast locking scheme, according to one embodiment of the disclosure.

FIG. 3 illustrates a plot 300 with waveforms showing operation of the fast locking scheme, according to one embodiment of the disclosure. It is pointed out that those elements of FIG. 3 having the same reference numbers (or names) as the elements of any other figure can operate or function in any manner similar to that described, but are not limited to such.

Here, the x-axis is time and y-axis is voltage. For each signal in plot 200, the y-axis runs from zero to Vdd volts, except for the phase_error signal. For the phase_error signal, the y-axis represents unit of time. The first waveform from the top is the resetDCO signal. The second waveform from the top is RefClk signal. The third waveform from the top is Outb4Clk signal (i.e., output of DCO 106). The fourth waveform from the top is FbClk signal. The fifth waveform from the top is phase_error signal (i.e., output of TDC 103). The sixth signal from the top is a signal indicating frequency (freq) lock signal.

In this embodiment, clock distribution 107 is absent or negligible (i.e., when delay of clock distribution 107 is less than one cycle of Outb4Clk). As discussed with reference to FIG. 1, after DPLL 100 acquires frequency lock, controller 104 causes divider 108 and DCO 106 to reset via resetDiv and resetDCO signals respectively. The low pulse of resetDCO indicates a reset operation (i.e., active low reset). During reset operation, Outb4Clk is held to a stable non-oscillating voltage level (in this case to a Vdd level). In this embodiment, resetDiv signal causes divider 108 to reset and so FbClk is zero. In one embodiment, after one RefClk cycle, resetDCO and resetDiv signals are released (i.e., reset operation ends) such that falling (or rising) edge of Outb4Clk signal is in synchronization with falling (or rising edge) of FbClk signal. As soon as reset is released, DCO 106 begins to oscillate. In this example, phase_error begins to settle to a peak-to-peak steady state with an average value of zero (ps) level which is indicated by the "locking" time region. In about four RefClk signal cycles after reset is released, DPLL 100 acquires phase lock which is indicated by the "locked" time region.

In one embodiment, divider 108 comprises counters (not shown) which can be reset by resetDiv signal. In one embodiment, to reset divider 108, its counters are reset and stopped from counting. The counters remain in reset until resetDiv signal indicates a reset release operation in which the counters being counting to cause FbClk signal edge to synchronize with RefClk signal edge. In one embodiment, to synchronize an edge (rising or falling) of FbClk signal to an edge (rising or falling) of RefClk signal, resetDiv signal causes divider 108 to release from reset such that the counter value matches half the value of counter setting. In such an embodiment, falling and rising edges of FbClk signal are generated when the counter value is equal to the counter setting.

Referring back to FIG. 1, the reset scheme of resetting both DCO 106 and divider 108 is also applicable for DPLLs with small clock distribution 107 (i.e., clock distribution with little propagation delay). In this embodiment, the delay of the clock distribution 107 adds to the phase error (i.e., phase_error) between RefClk signal and FbClk signal i.e., phase error after resetting DCO 106 and divider 108, and releasing them from reset, may depend on the delay of clock distribution 107. Here, as the delay of the clock distribution 107 increases, the time that DPLL 100 may take to phase lock may increase compared to the case when there is no clock distribution. However, the reset scheme of the embodiments still improves phase lock time compared to traditional fast phase lock schemes.

Figure 4:
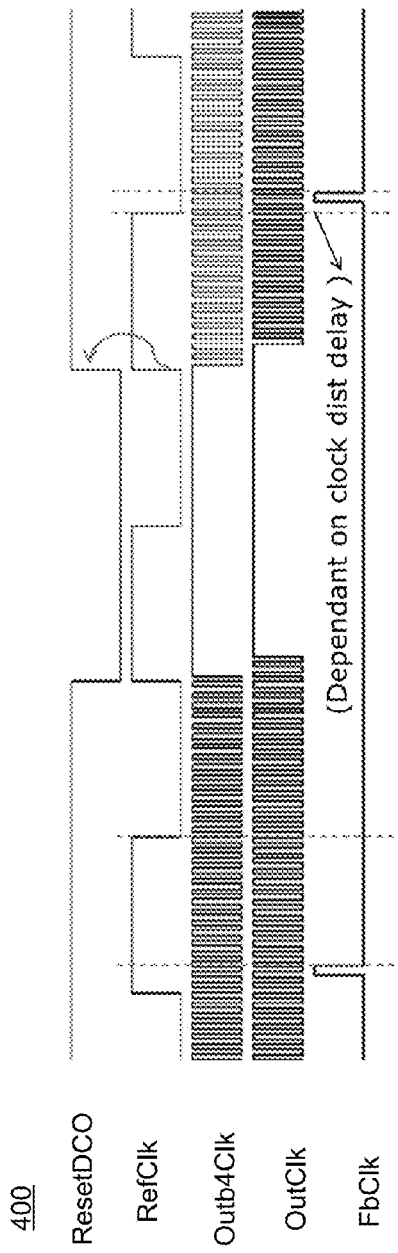
FIG. 4 illustrates plot with waveforms showing operation of the fast locking scheme, with impact of clock distribution, in which both DCO and divider are reset, according to one embodiment of the disclosure.

FIG. 4 illustrates plot 400 with waveforms showing operation of the fast locking scheme, with impact of clock distribution, in which both DCO 106 and divider 108 are reset, according to one embodiment of the disclosure. It is pointed out that those elements of FIG. 4 having the same reference numbers (or names) as the elements of any other figure can operate or function in any manner similar to that described, but are not limited to such.

Here, the x-axis is time and y-axis is voltage. For each signal in plot 400, the y-axis runs from zero to Vdd volts. The first waveform from the top is the resetDCO signal. The second waveform from the top is RefClk signal. The third waveform from the top is Outb4Clk signal (i.e., output of DCO 106). The fourth waveform from the top is OutClk signal (i.e., output of clock distribution 106). The fifth waveform from the top is FbClk signal.

As discussed with reference to FIG. 1, after DPLL 100 acquires frequency lock, controller 104 causes divider 108 and DCO 106 to reset via resetDiv and resetDCO signals respectively. The low pulse of resetDCO signal indicates a reset operation (i.e., active low reset). During reset operation, Outb4Clk signal and OutClk signal (after a delay of the clock distribution 107) are held to a stable non-oscillating voltage level (in this case to a Vdd level). In this embodiment, resetDiv signal causes divider 108 to reset and so FbClk signal is zero. In one embodiment, after one RefClk signal cycle, resetDCO and resetDiv signals are released (i.e., reset operation ends) such that falling (or rising) edge of Outb4Clk signal is in synchronization with falling (or rising) edge of FbClk signal. As soon as reset is released, DCO 106 begins to oscillate. This embodiment may exhibit some phase error as shown by the two dotted vertical dashed lines on the FbClk signal pulse to the right, the phase error is small enough to keep DPLL 100 locked. Again, in this embodiment, lock time is reduced to a few RefClk signal cycles after reset is engaged and released.

Referring back to FIG. 1, in one embodiment, controller 104 only resets divider 108 (i.e., DCO 106 is not reset) when the clock distribution is long and has a large delay (e.g., delay of clock distribution is much larger than a period of Outb4Clk signal). In this embodiment, DCO 106 continues to oscillate when divider 108 is reset. In such an embodiment, delay of clock distribution 107 does not affect the phase error because DCO 106 continues to oscillate. In one embodiment, rising (or falling) edge of FbClk signal is synchronized with rising (or falling) edge RefClk signal when reset is released. In one embodiment, divider 108 is modified to be a double edge triggered divider to reduce the worst case delay of the loop divider (e.g., 1 OutClk cycle) into half OutClk cycle and hence reduce the worst case phase error between RefClk and FbClk after releasing the reset signal into half OutClk cycle.

Figure 5:
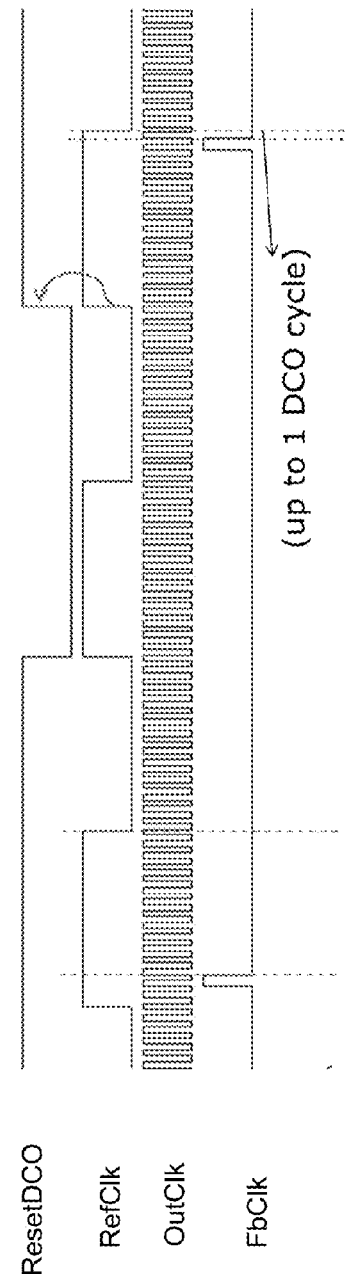
FIG. 5 illustrates plot with waveforms showing operation of the fast locking scheme, with impact of clock distribution, in which only the divider is reset, according to one embodiment of the disclosure.

FIG. 5 illustrates plot 500 with waveforms showing operation of the fast locking scheme, with impact of clock distribution, in which only divider 108 is reset, according to one embodiment of the disclosure. It is pointed out that those elements of FIG. 5 having the same reference numbers (or names) as the elements of any other figure can operate or function in any manner similar to that described, but are not limited to such.

Here, the x-axis is time and y-axis is voltage. For each signal in plot 500, the y-axis runs from zero to Vdd volts. The first waveform from the top is the resetDCO signal. The second waveform from the top is RefClk signal. The third waveform from the top is OutClk signal (i.e., output of DCO 106). The fourth waveform from the top is FbClk signal. In this embodiment, DCO 106 continues to oscillate when controller 104 resets divider 108 via resetDiv signal.

In one embodiment, controller 104 adjusts coefficients of digital filter 105 when reset (resetDIV and/or resetDCO) is released. In such an embodiment, controller 104 adjusts filter coefficients to increase bandwidth of DPLL 100 to acquire phase lock quickly.

Figure 6:
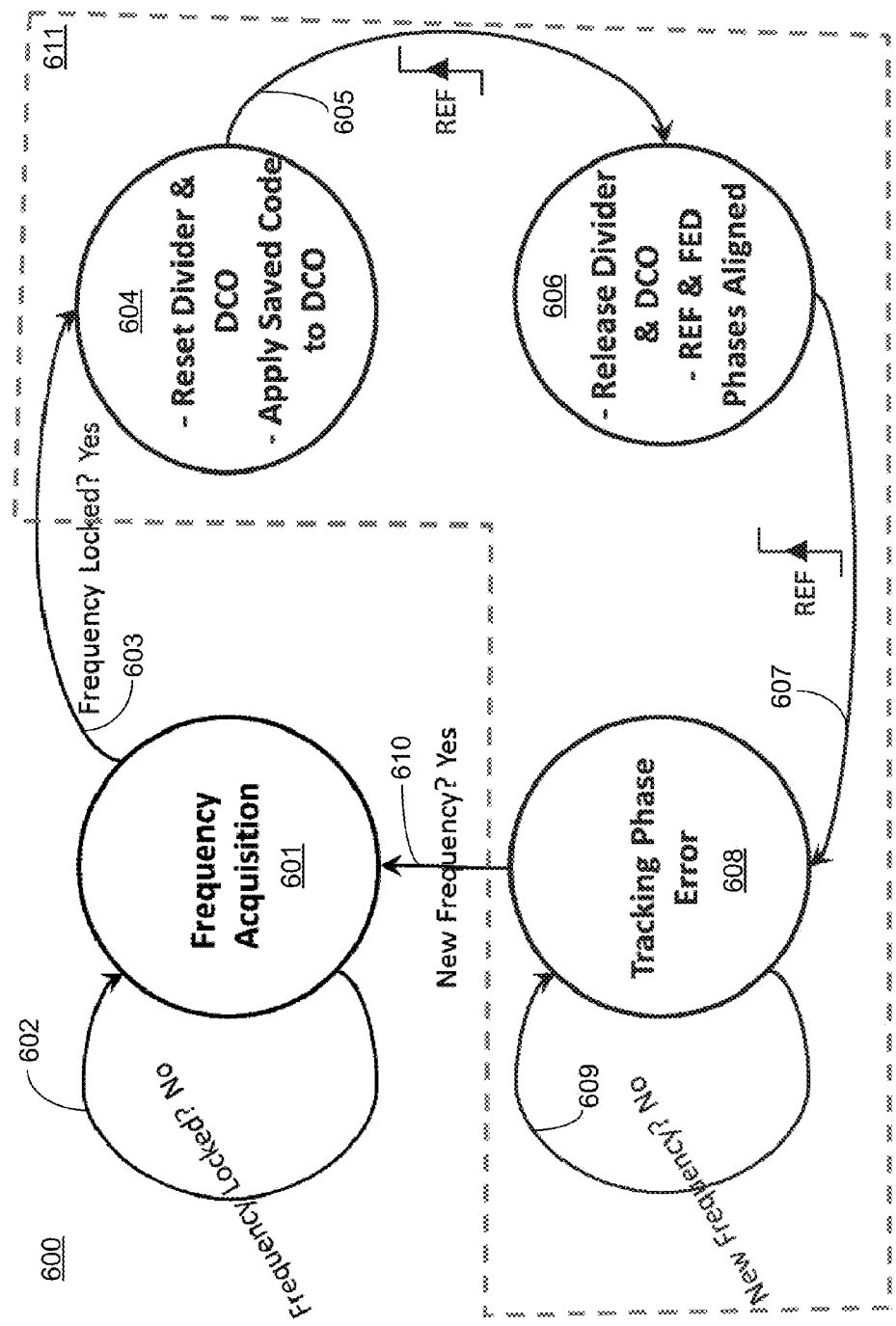
FIG. 6 illustrates a finite state machine (FSM) for implementing fast locking scheme, according to one embodiment of the disclosure.

FIG. 6 illustrates a finite state machine (FSM) 600 for implementing fast locking scheme, according to one embodiment of the disclosure. It is pointed out that those elements of FIG. 6 having the same reference numbers (or names) as the elements of any other figure can operate or function in any manner similar to that described, but are not limited to such.

In one embodiment, controller 104 implements FSM 600. In one embodiment, upon waking up, DPLL 100 proceeds with frequency lock acquisition at block (or state) 601. At block 601, FSM 600 samples an output of a frequency comparator (not shown) and applies a binary search to lock the frequency close to the target frequency. During execution of block 601, controller 104 periodically checks for frequency lock as indicated by arrow 602. If frequency lock is acquired as indicated by arrow 603, then FSM 600 proceeds to block 604. In one embodiment, after frequency lock is acquired, FSM 600 switches to phase detector 102 and TDC 103 to lock phase and correct frequency error linearly through a proportional integral filter (or digital filter 105)

At block 604, controller 104 determines whether an intervening clock distribution network 107 exists between DCO 106 and divider 108. If there is a clock distribution 107, then it is determined whether delay through the clock distribution 107 is less than or greater than a cycle of Outb4Clk. If delay through the clock distribution 107 is less than a cycle of Outb4Clk, or if the clock distribution 107 does not exist, then controller 104 issues reset signals resetDiv and resetDCO for divider 108 and DCO 106 respectively. If delay through the clock distribution 107 is much greater than a cycle of Outb4Clk signal, then controller 104 issues resetDiv signal only for divider 108. At block 601, code for controlling oscillation frequency of DCO 106 is also saved in a storage area. The saved code is applied with reset signal at block 604 to make DCO oscillating frequency as close as possible to the target frequency when the reset is released.

After resetting divider 108 and/or DCO 106, FSM 600 proceeds to block 606 in the next reference clock cycle as indicated by arrow 605. At block 606, divider 108 and/or DCO 106 are released from reset operation and allowed to operate normally. In such an embodiment, divider 108 starts dividing OutClk signal in synchronization with RefClk i.e., falling (or rising) edge of FbClk signal is in synchronization with falling (or rising) edge of RefClk signal. At releasing DPLL 100 from reset condition, FSM 600 proceeds to block 608 on the next RefClk signal cycle as indicated by arrow 607.

At block 608, phase error is tracked by TDC 103 and/or phase detector 102. If the phase error is below a predetermined threshold, then DPLL 100 is declared lock. In such an embodiment, controller 104 continues to monitor phase error as indicated by arrow 609. In one embodiment, at the end of lock acquisition, digital code to DCO 106 is stored in a look-up table or storage unit to be retrieved when the DPLL switches to that frequency. In one embodiment, if DPLL 100 is instructed to operate at a different frequency, then FSM 600 proceeds to block 601 to start the process of frequency acquisition as indicated by arrow 610. In one embodiment, in case of temperature drift, the save and restore mechanism will lead to a slight frequency error (±one frequency band due to the dense band coverage of the DCO) that will be corrected by the fast frequency calibration in two RefClk cycles or by the normal frequency acquisition algorithm. In one embodiment, states in the dotted region 611 result in fast lock acquisition of DPLL 100.

Figure 7:
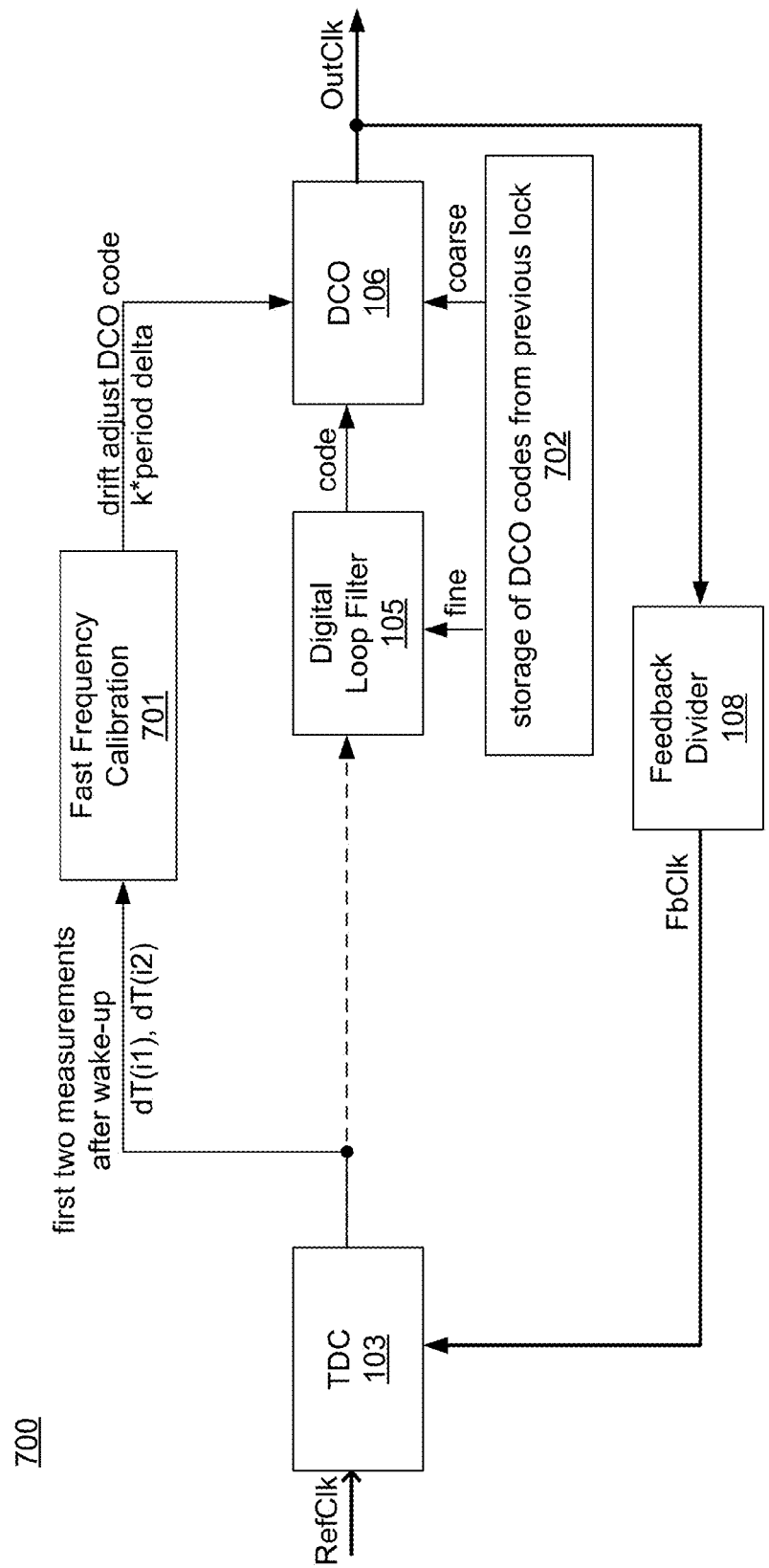
FIG. 7 illustrates a DPLL with fast frequency calibration using time derivative method, according to one embodiment of the disclosure.

FIG. 7 illustrates a DPLL 700 with fast frequency calibration using time derivative method, according to one embodiment of the disclosure. It is pointed out that those elements of FIG. 7 having the same reference numbers (or names) as the elements of any other figure can operate or function in any manner similar to that described, but are not limited to such. So as not to obscure the embodiment, differences between DPLL 100 and DPLL 700 are discussed.

In one embodiment, DPLL 700 comprises a fast frequency calibration unit 701 which calibrates frequency of DCO 106 using fine tuning control of DCO 106 such that frequency of FbClk signal matches the frequency of RefClk signal within a pre-defined acceptable tolerance limit (e.g., within 5%). Typically, for a DPLL to acquire frequency lock, many RefClk signal cycles are used. In one embodiment, fast frequency calibration unit 701 enables DPLL 700 to acquire frequency lock in two RefClk signal cycles.

In one embodiment, fast frequency calibration unit 701 uses TDC 103 to analyze frequency difference between RefClk and FbClk signals over two time points—$dT(i1)$ and $dT(i2)$, where 'i' is an integer representing a specific reference clock edge, or moment in time, after the DPLL is reset for which the TDC measurement is done. For example, if the DPLL cycle is i=1, and measurement is started at i=1, then i1=1 and i2=2 or greater. In some cases, i2=3, or i2=4 or more. In such embodiments, each additional cycle provides more precise measurement against possible jitter in RefClk. The embodiments are not limited to using TDC 103 to determine the frequency difference. Other hardware and/or software (having sub-DCO period granularity phase measurement capability) may be used to determine frequency difference between RefClk and FbClk signals over two time points. In one embodiment, fast frequency calibration unit 701 uses the frequency difference information to adjust DCO frequency control code (i.e., k*period delta, where 'k' is constant that depends on gain of DCO 106).

In one embodiment, prior to starting the process of frequency calibration by fast frequency calibration unit 701, fine and coarse control codes for the digital loop filter 105 and/or DCO 106 are retrieved from a storage area 702 and applied to digital loop filter 105 and/or DCO 106. In such an embodiment, frequency of FbClk signal is close to frequency of RefClk signal, and the difference between those two frequencies is then calibrated by digital loop filter 105 and/or DCO 106.

In one embodiment, information from TDC 103 regarding the two measurements is also used by digital loop filter 105 to adjust its filter coefficients to acquire fast lock. For example, digital loop filter 105 increases bandwidth of DPLL 700 so that frequency lock is acquired faster.

Figure 8:
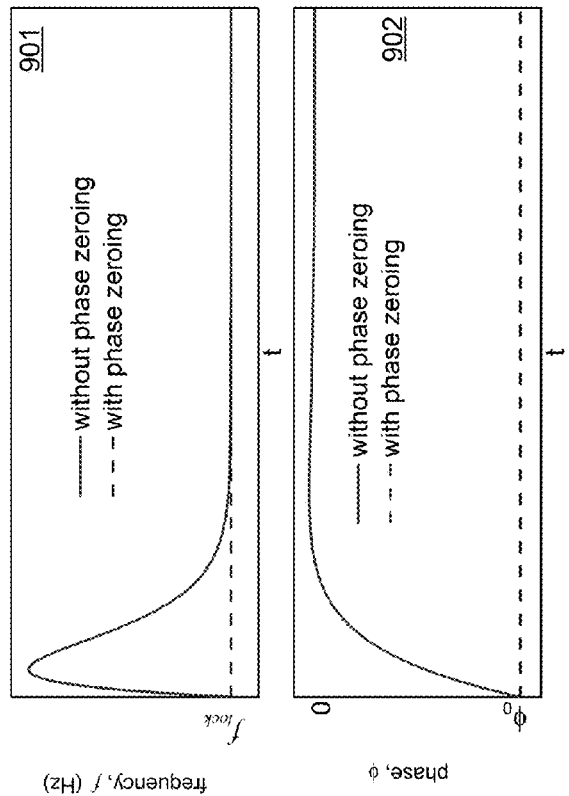
FIG. 8 illustrates a state machine for fast frequency calibration, according to one embodiment of the disclosure.

FIG. 8 illustrates a state machine 800 for fast frequency calibration, according to one embodiment of the disclosure. It is pointed out that those elements of FIG. 8 having the same reference numbers (or names) as the elements of any other figure can operate or function in any manner similar to that described, but are not limited to such.

At block 801, first cycle of TDC 103 dT(i1) is measured. At block 802, second cycle of TDC 103 dT(i2) is measured. At block 803, time derivative period_delta(i) is measured as:

period_delta($i$)=($\Delta dT$)/($\Delta$reference clock periods)

period_delta($i$)=($dT(i2)-dT(i1)$)/($i2-i1$)

At block 804, oscillating frequency of DCO 106 is adjusted by frequency calibration unit 701 by multiplying with period_delta(i), where 'k' is a predetermined scalar value that is related to gain of DCO 106. In one embodiment, after adjusting oscillation frequency of DCO 106, phase of RefClk and FbClk signals are aligned by resetting divider 108 and/or DCO 106 and releasing them from reset condition such that RefClk is synchronized with FbClk.

In one embodiment, hardware is provided in DPLL 100/700 for instant phase lock using a phase error zeroing method (also referred to as a phase offset subtraction method). In one embodiment, with the phase error zeroing method, DPLL 100/700 achieves near instant lock, or lock on the first edge of RefClk signal cycle, instead of the many RefClk signal cycles it normally requires without this technique.

Figure 9:
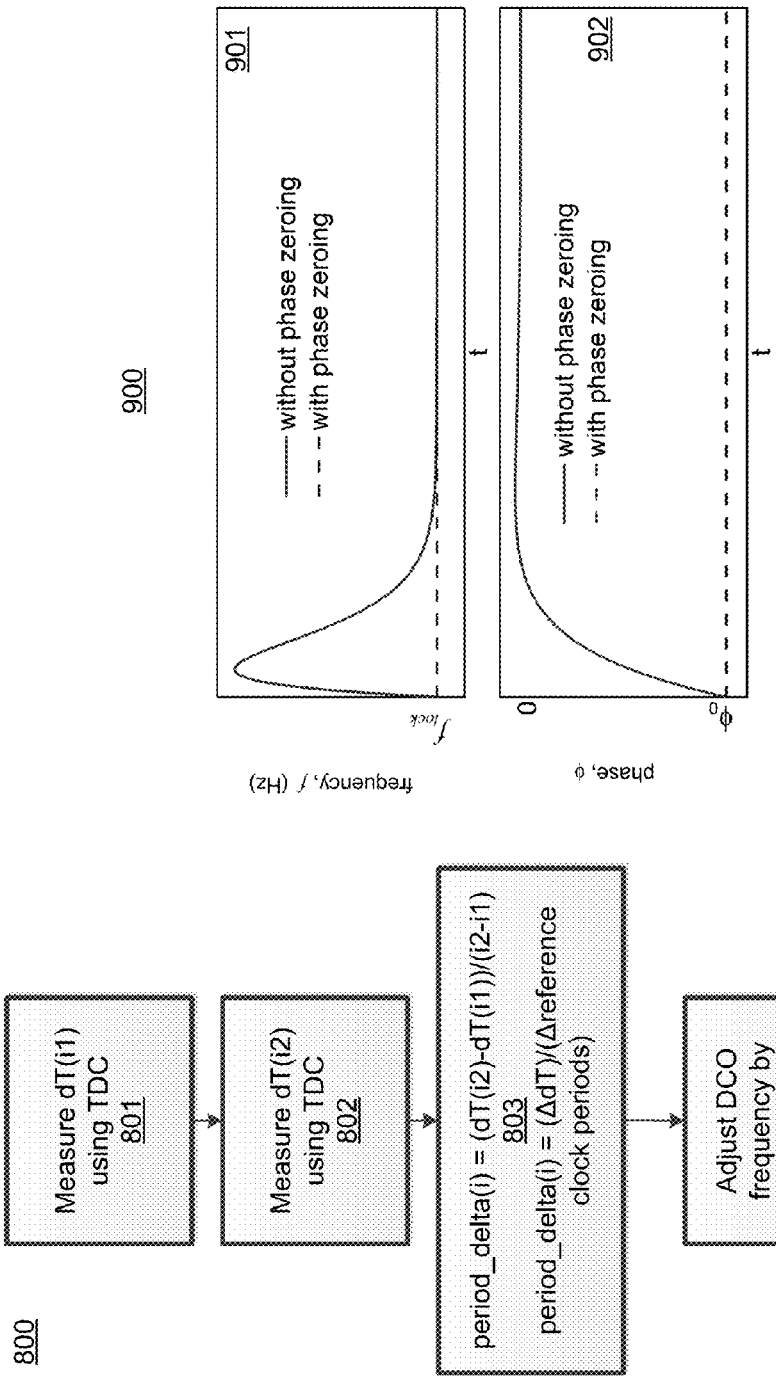
FIG. 9 illustrates plots showing frequency and phase with and without phase error zeroing method, according to one embodiment of the disclosure.

FIG. 9 illustrates plots 900 showing frequency and phase with and without phase error zeroing method, according to one embodiment of the disclosure. It is pointed out that those elements of FIG. 9 having the same reference numbers (or names) as the elements of any other figure can operate or function in any manner similar to that described, but are not limited to such.

For plot 901, x-axis is time and y-axis is frequency (f) in Hz. For plot 902, x-axis is time and y-axis is phase ($\Phi$). The solid waveforms in plots 901 and 902 are waveforms for DPLLs without using phase zeroing method. The dashed waveforms in plots 901 and 902 are waveforms for DPLLs with application of phase zeroing method. The plots show that phase error zeroing method enables constant frequency and phase lock at beginning of time when DPLL 100/700 are enabled, whereas normal method without phase zeroing requires much longer time.

Figure 10:
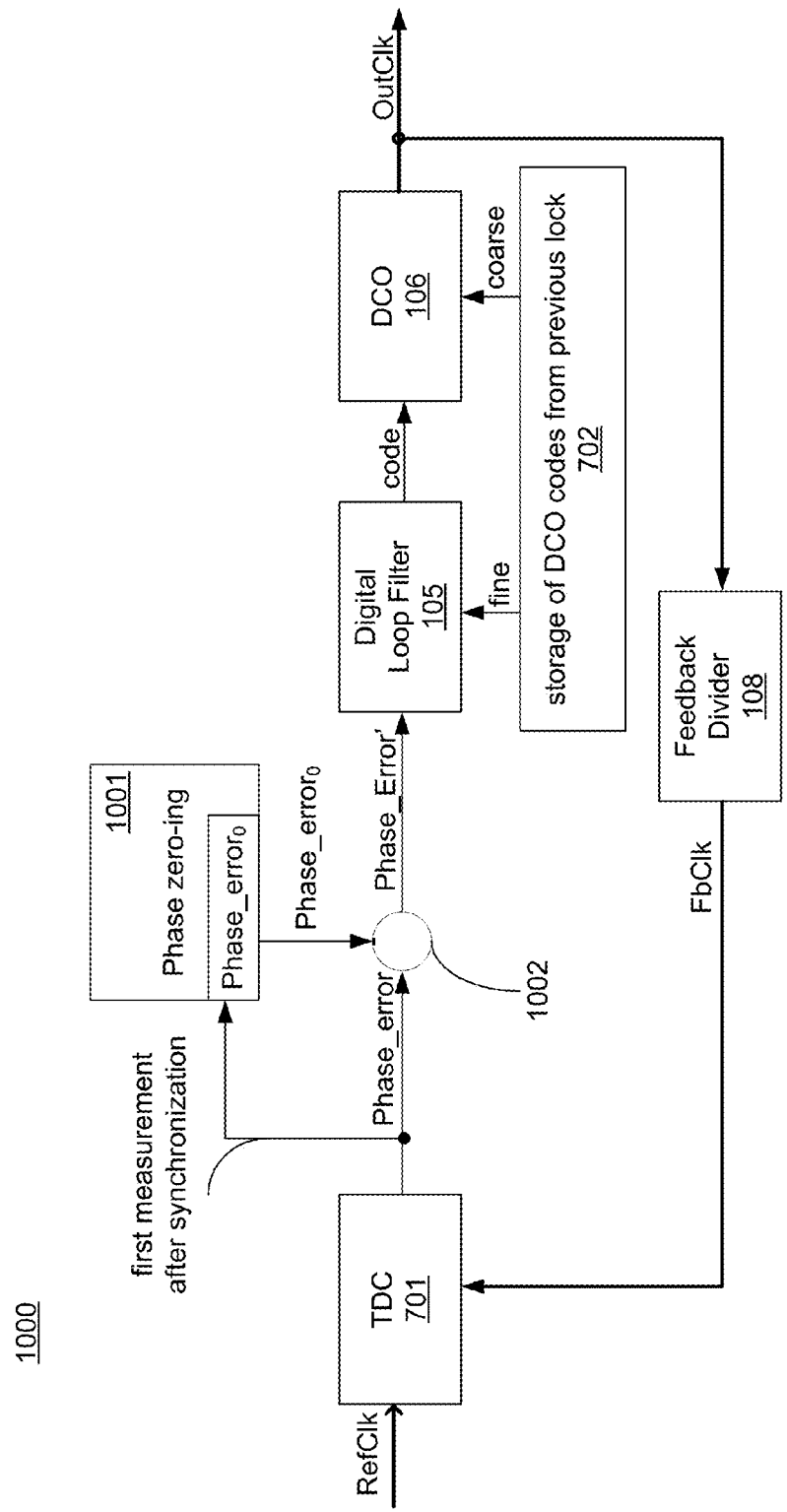
FIG. 10 illustrates a DPLL with phase error zeroing, according to one embodiment of the disclosure.

FIG. 10 illustrates a DPLL 1000 with phase error zeroing, according to one embodiment of the disclosure. It is pointed out that those elements of FIG. 10 having the same reference numbers (or names) as the elements of any other figure can operate or function in any manner similar to that described, but are not limited to such. So as not to obscure the embodiments, differences between DPLL 100 (or 700) and 1000 are discussed.

In one embodiment, DPLL 1000 comprises circuit 1001 for phase zeroing and subtractor 1002. In one embodiment, circuit 1001 is an FSM for performing and/or controlling the phase zeroing method. In one embodiment, subtractor 1002 subtracts initial measured phase error (Phase_error$_0$) from TDC phase error measurement (Phase_error). Here, Phase_error$_0$ is measured after divider 108 is reset i.e., Phase_error$_0$ is the first phase error measurement after synchronization. As discussed with reference to FIG. 1, synchronization is achieved by releasing divider 108 and/or DCO 106 from reset such that falling (or rising) RefClk and FbClk signal edges are synchronized in time. In one embodiment, output (Phase_Error') of subtractor 1002 is the corrected TDC phase error measurement and applied to digital loop filter 105 for all subsequent cycles until DPLL 1000 is disabled (or powered down). The correct TDC phase error is expressed as:

Phase_Error'=Phase_error–Phase_error$_0$

With the above embodiment, DPLL 1000 acquires phase lock substantially instantly (i.e., accounting for non-idealities that may introduce some delay to phase locking) on the first RefClk cycle after divider 108 is reset.

Figure 11A:
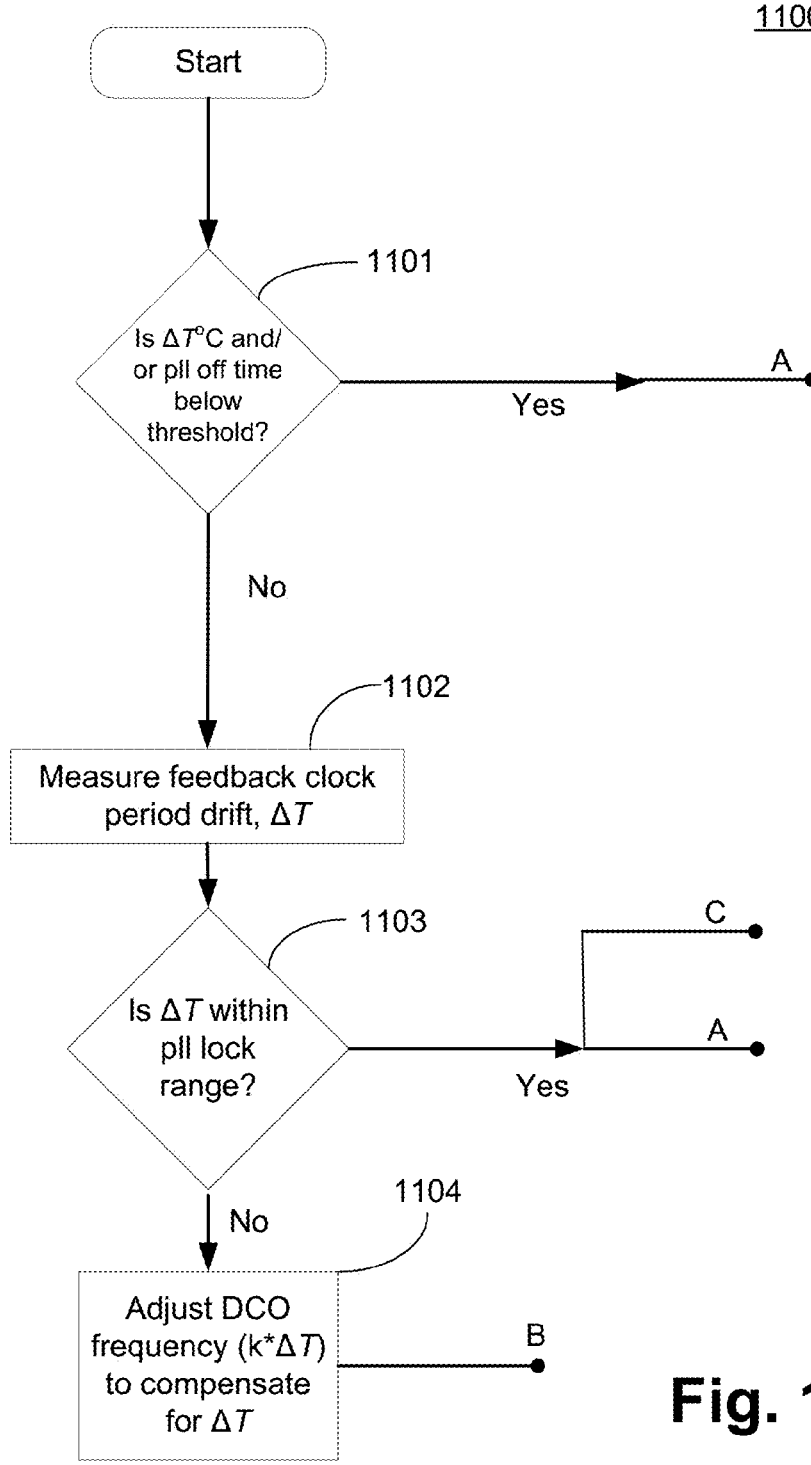
FIG. 11A-C illustrate a flowchart for fast locking of a DPLL, according to one embodiment of the disclosure.
Figure 11B:
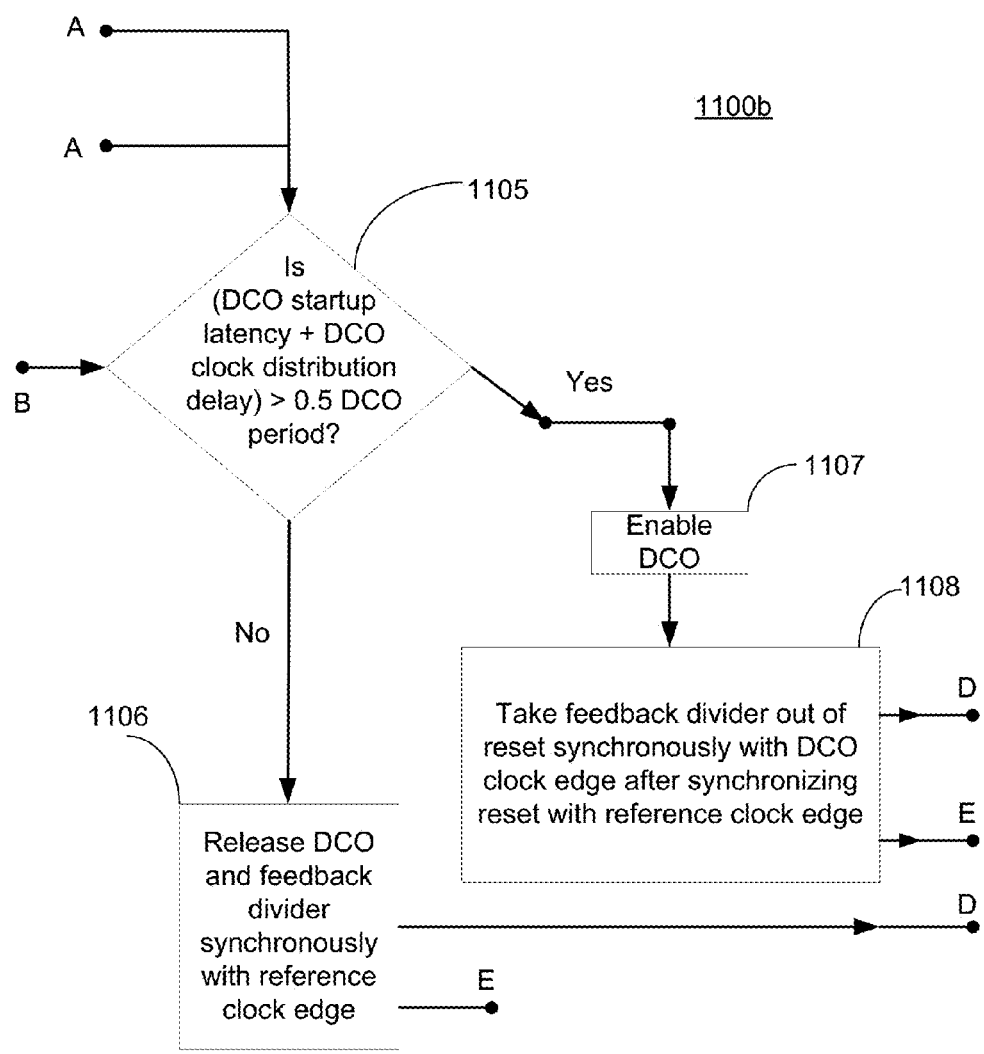
Figure 11C:
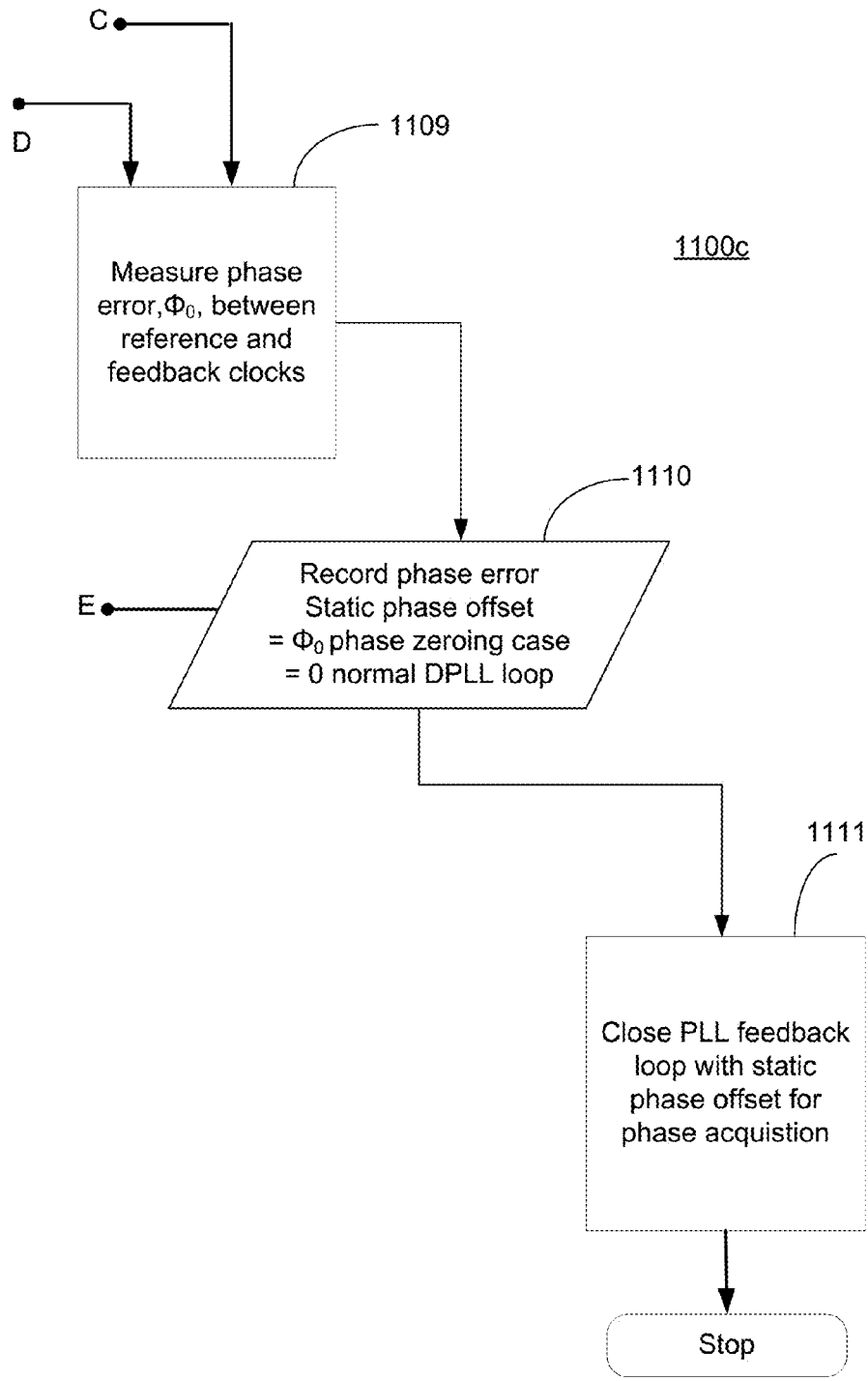

FIG. 11A-C illustrate flowcharts for fast lock of a DPLL, according to one embodiment of the disclosure. It is pointed out that those elements of FIGS. 11A-C having the same reference numbers (or names) as the elements of any other figure can operate or function in any manner similar to that described, but are not limited to such.

In one embodiment, flowchart 1100a is performed in open loop for frequency drift compensation. Once DPLL 100 (700 or 1000) wakes up, at block 1101 a determination is made whether change in temperature (from the time DPLL previously locked before it was shut down and now when the DPLL is restarted) is below a predetermined change in temperature. If change in temperature is below the predetermined change in temperature, then the process proceeds to FIG. 11B from point A, else the process proceeds to block 1102. In one embodiment, if elapsed time (e.g., time when PLL is off) is under a threshold, then frequency calibration process can be skipped because temperature drift is small enough to be ignored. In one embodiment, elapsed time is measured by a counter that counts a number of RefClk cycles or other clock cycles.

At block 1102, FbClk signal period drift $\Delta T$ as discussed with reference to FIG. 8 (i.e., blocks 801-803) is measured. At block 1103 a determination is made whether period drift $\Delta T$ within a predetermined threshold (e.g., a lock range for DPLL). If the period drift $\Delta T$ is within the predetermined threshold, then the process proceeds to FIG. 11B from point A and C, else the process proceeds to block 1104. At block 1104, frequency of DCO 106 is adjusted to compensate for period drift $\Delta T$ as discussed with reference to block 804 in FIG. 8. After completing block 1104, the process proceeds to FIG. 11B from point B.

In one embodiment, flowchart 1100*b* is also performed in open loop. At block 1105, process of 1100*a* for points A and B continue. At block 1105, a determination is made whether first cycle of OutClk or Outb4Clk has a delay greater than half a period of OutClk or Outb4Clk respectively, where the period of OutClk or Outb4Clk is the period when DPLL was previously locked. In one embodiment, block 1105 is performed at design phase and is not part of the FSM. In such an embodiment, depending on the design, if DCO startup latency and DCO clock distribution delay together is greater than half a period of DCO cycle (i.e., Outb4Clk cycle), then inputs A and B proceed to block 1107, else inputs A and B proceed to block 1106.

At block 1106, controller releases divider 108 and/or DCO 106 from reset such that falling (or rising) edge of FbClk signal is synchronized with falling (or rising) edge of RefClk signal. The process then proceeds to points D and E of FIG. 11C. At block 1107, controller 104 resets DCO 106 and divider 108, and releases DCO 106 from reset to enable DCO 106 to oscillate. If DCO 106 is an LC (inductor-capacitor) tank based oscillator, then DCO 106 is enabled (by controller 104) to oscillate at block 1107. For example, an LC DCO with long startup time and/or RO (ring-oscillator) DCO with long loop feedback may follow the process from block 1107. In an example when RO DCO has a shorter startup time and shorter feedback loop, then process may continue from block 1106. After enabling DCO 106 at block 1107, the process then proceeds to block 1108. At block 1108, divider 108 is released from reset synchronously with OutClk signal edge after synchronizing reset with RefClk signal edge. In one embodiment, divider 108 is released from reset synchronously with OutClk signal edge after synchronizing the reset with RefClk signal edge. In such an embodiment, FbClk signal starts up with minimal phase error with respect to RefClk. The process then proceeds to point D of FIG. 11C.

In one embodiment, flowchart 1100*c* performs phase zeroing method. At block 1109, process of 1100*a* for point C and process of 1100*b* for points D continues. At block 1109, phase error $\Phi_0$ (i.e., Phase_error$_0$) is measured between RefClk and FbClk, and process proceeds to block 1110. At block 1110, process of 1100*b* for points E continues. At 1110, Phase_error$_0$ is recoded and phase zeroing method is performed as discussed with reference to FIGS. 9-10. At block 1111, DPLL loop is closed for phase lock acquisition with static phase offset correction.

In one embodiment, the process of fast locking after wake-up of the PLL comprises: restoring the saved frequency control codeword for the DCO; correcting frequency to compensate for temperature drift (i.e., performing fast frequency calibration); resetting the divider and/or the DCO depending on the delay of the clock distribution network; and correcting phase error using loop dynamics and phase error zeroing method.

Figure 12:
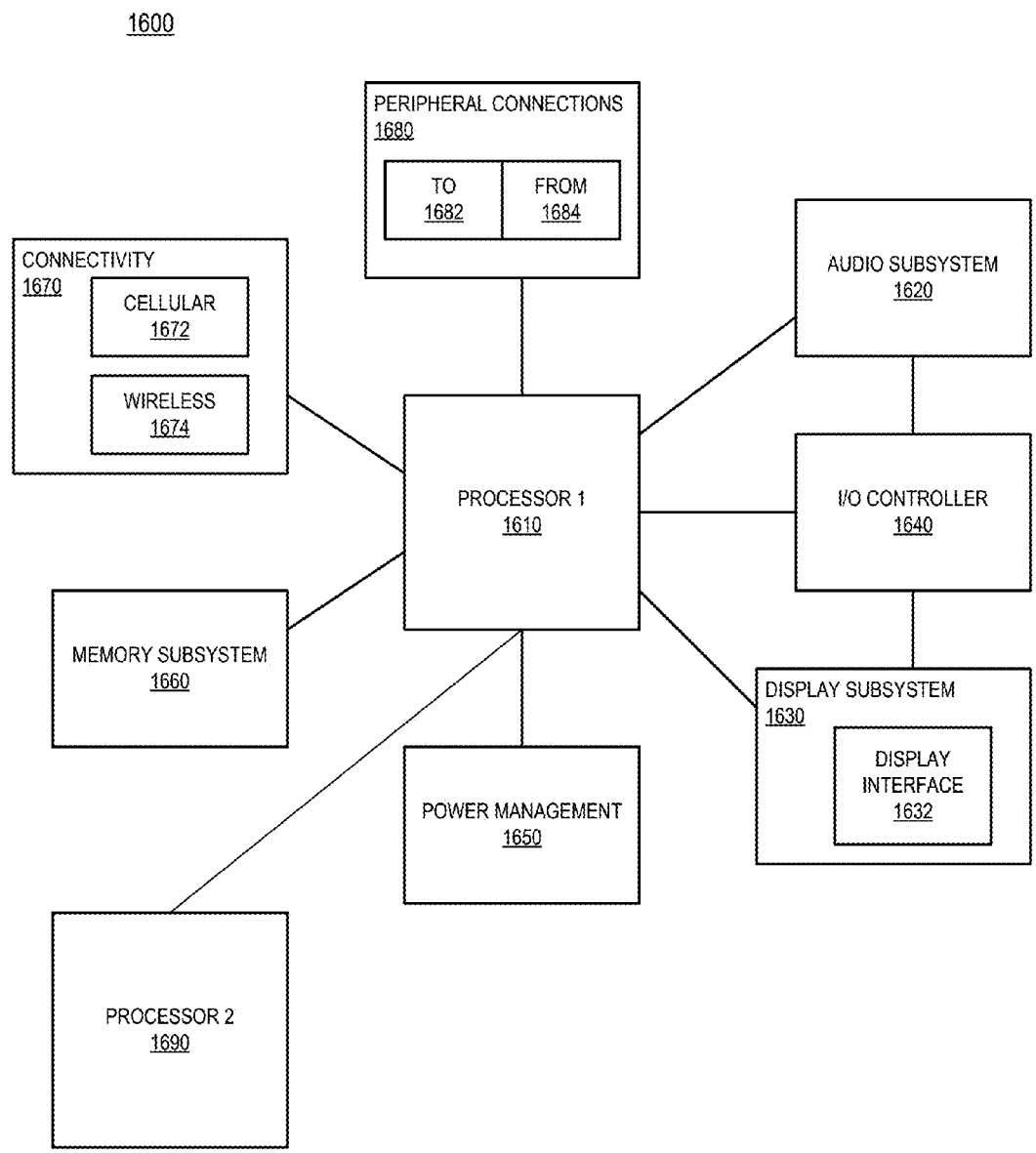
FIG. 12 is a smart device or a computer system or an SOC (system on chip) with a DPLL having circuits for fast locking, according to one embodiment of the disclosure.

FIG. 12 is a smart device or a computer system or an SOC (system on chip) with a DPLL having circuits for fast locking, according to one embodiment of the disclosure. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with a DPLL having circuits for fast locking, according to the embodiments discussed. Other blocks of the computing device 1600 may also include a PLL having circuits for fast locking. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. Processor 1690 may be optional, in one embodiment. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an integrated circuit (IC) is provided which comprises: a node to provide a reference clock; a digitally controlled oscillator (DCO) to generate an output clock; a divider coupled to the DCO, the divider to divide the output clock and to generate a feedback clock; and control logic operable to reset or disable the DCO and the divider, and operable to release reset in synchronization with the reference clock. In one embodiment, the DCO comprises a plurality of DCO cells and switches, wherein each switch is coupled to an output of a DCO cell of the plurality of DCO cells, and wherein each switch is operable to couple the output of the DCO cell to a known voltage level.

In one embodiment, the DCO is an LC based DCO which is operable to be enabled to oscillate when reset is released. In one embodiment, the control logic is operable to control the switches. In one embodiment, the divider is operable to divide the output clock in synchronization with the reference clock when the control logic releases reset. In one embodiment, the IC further comprises a digital loop filter (DLF) coupled to provide a digital control word to the DCO. In one embodiment, the control logic is operable to adjust filter coefficients of the DLF when the control logic is to reset the divider.

In one embodiment, the IC further comprises a clock distribution network to receive output clock of the DCO, and wherein the divider to divide a clock received from the clock distribution network. In one embodiment, the control logic to reset only the divider when delay of the clock distribution network is substantially greater than one cycle of the output clock. In one embodiment, the control logic to reset the divider and the DCO when delay of the clock distribution network is less than one cycle of the output clock.

In another example, a system is provided which comprises: a memory; an integrated circuit coupled to the memory, the integrated circuit according to the IC discussed above; and a wireless interface for allowing the integrated circuit to communicate with another device. In one embodiment, the integrated circuit forms part of a digital phase locked loop (DPLL). In one embodiment, the system comprises a display unit. In one embodiment, the display unit is a touch screen.

In another example, a method for fast frequency calibration of a digital phase locked loop (DPLL) is provided. In one embodiment, the method comprises: determining at a first time, by a time-to-digital converter (TDC), a first time difference between feedback clock and reference clock; determining at a second time, by the TDC, a second time difference between feedback clock and reference clock, the second time being larger than the first time; determining a difference between the first and second time differences; and adjusting oscillating frequency of a digitally controlled oscillator (DCO) according to the determined difference. In one embodiment, the operations of determining and adjusting to be performed when the DPLL wakes up from a low power mode or off state.

In another example, an apparatus is provided which comprises: a first node to provide a reference clock; a second node to provide a feedback clock; a time-to-digital converter (TDC), coupled to the first and second nodes, to measure phase error between the reference clock and the feedback clock; a digital loop filter; and a control unit to adjust the measured phase error, and to provide the adjusted phase error to the digital loop filter.

In one embodiment, the control unit to adjust the measured phase error by subtracting an initial measured phase error from the measured phase error. In one embodiment, the apparatus further comprises a divider which is operable to be reset by the control unit, wherein the TDC to provide the initial measured phase error when the divider is reset.

In another example, a system is provided which comprises: a memory; a processor coupled to the memory, the processor having a digital phase locked loop (DPLL) according to the apparatus discussed above; and a wireless interface for allowing the processor to communicate with another device. In one embodiment, the system further comprises a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An integrated circuit (IC) comprising:
a node to provide a reference clock;
a digitally controlled oscillator (DCO) to generate an output clock;
a divider coupled to the DCO, the divider to divide the output clock and to generate a feedback clock;
control logic operable to reset or disable the DCO and the divider, and operable to release reset in synchronization with the reference clock; and
a clock distribution network to receive output clock of the DCO, wherein the divider is operable to divide a clock received from the clock distribution network.

2. The IC of claim 1, wherein the DCO comprises a plurality of DCO cells and switches, wherein each of the switches is coupled to an output of a DCO cell of the plurality of DCO cells, and wherein each of the switches is operable to couple the output of the DCO cell to a known voltage level.

3. The IC of claim 1, wherein the DCO is operable to oscillate when reset is released.

4. The IC of claim 2, wherein the control logic is operable to control the switches.

5. The IC of claim 1, wherein the divider is operable to divide the output clock in synchronization with the reference clock when the control logic releases reset.

6. The IC of claim 1, wherein the control logic is operable to reset only the divider when delay of the clock distribution network is substantially greater than one cycle of the output clock.

7. The IC of claim 1, wherein the control logic is operable to reset the divider and the DCO when delay of the clock distribution network is less than one cycle of the output clock.

8. An integrated circuit (IC) comprising:
a node to provide a reference clock;
a digitally controlled oscillator (DCO) to generate an output clock;
a divider coupled to the DCO, the divider to divide the output clock and to generate a feedback clock;

control logic operable to reset or disable the DCO and the divider, and operable to release reset in synchronization with the reference clock; and a digital loop filter (DLF) coupled to provide a digital control word to the DCO.

9. The IC of claim 8, wherein the control logic is operable to adjust filter coefficients of the DLF when the control logic is to reset the divider.

10. The IC of claim 8, wherein the DCO comprises a plurality of DCO cells and switches, wherein each of the switches is coupled to an output of a DCO cell of the plurality of DCO cells, and wherein each of the switches is operable to couple the output of the DCO cell to a known voltage level.

11. The IC of claim 8, wherein the DCO is operable to oscillate when reset is released.

12. The IC of claim 10, wherein the control logic is operable to control the switches.

13. The IC of claim 8, wherein the divider is operable to divide the output clock in synchronization with the reference clock when the control logic releases reset.

14. A system comprising:
a memory;
an integrated circuit coupled to the memory, the integrated circuit comprising:
    a node to provide a reference clock;
    a digitally controlled oscillator (DCO) to generate an output clock;
    a divider coupled to the DCO, the divider to divide the output clock and to generate a feedback clock;
    control logic operable to reset or disable the DCO and the divider, and operable to release reset in synchronization with the reference clock; and
    a clock distribution network to receive output clock of the DCO, wherein the divider is operable to divide a clock received from the clock distribution network; and
a wireless interface for allowing the integrated circuit to communicate with another device.

15. The system of claim 14, wherein the integrated circuit forms part of a digital phase locked loop (DPLL).

16. The system of claim 14 further comprises a display unit.

* * * * *